United States Patent [19]
Shen et al.

[11] Patent Number: 6,069,507
[45] Date of Patent: May 30, 2000

[54] CIRCUIT AND METHOD FOR REDUCING DELAY LINE LENGTH IN DELAY-LOCKED LOOPS

[75] Inventors: Feng Shen; Kunlin Tsai, both of San Jose, Calif.

[73] Assignee: Silicon Magic Corporation, Sunnyvale, Calif.

[21] Appl. No.: 09/083,790

[22] Filed: May 22, 1998

[51] Int. Cl.[7] ........................................ H03L 7/06
[52] U.S. Cl. .......................... 327/156; 327/158; 327/155; 327/270
[58] Field of Search ..................... 327/270, 271, 327/276, 277, 278, 284, 285, 145, 146, 147, 149, 150, 155, 156, 158, 159

[56] References Cited

U.S. PATENT DOCUMENTS

| | | | |
|---|---|---|---|
| 4,789,996 | 12/1988 | Butcher | 327/15 |
| 5,544,203 | 8/1996 | Casasanta et al. | 327/149 |
| 5,629,651 | 5/1997 | Mizuno | 327/158 |
| 5,744,991 | 4/1998 | Jefferson et al. | 327/158 |
| 5,771,264 | 6/1998 | Lane | 327/158 |

*Primary Examiner*—Timothy P. Callahan
*Assistant Examiner*—An T. Luu
*Attorney, Agent, or Firm*—Sawyer Law Group LLP

[57] ABSTRACT

A digital delay lock loop (DLL) circuit for clock signals with reduced delay line length includes a first phase difference detector for detecting a first phase difference, and a second phase difference detector for detecting a second phase difference. The circuit further includes an inverter for inverting an input clock signal, and a switch controlled by the second phase difference detector for switching between the input clock signal and the inverted input clock signal in accordance with the second phase difference to provide a clock signal to the first phase difference detector. In a method aspect, a method for reducing delay line length in a digital delay locked loop (DLL) includes determining a phase difference between an input clock signal and a feedback clock signal, and maintaining the phase difference between the input clock signal and the feedback clock signal within approximately 180°. The method also includes delaying the input clock signal to compensate for the phase difference, wherein a number of delay cells utilized is reduced by approximately one-half.

16 Claims, 2 Drawing Sheets

CIRCUIT AND METHOD FOR REDUCING DELAY LINE LENGTH IN DELAY-LOCKED LOOPS

FIELD OF THE INVENTION

The present invention relates to delay-locked loops (DLLs) and more particularly to reducing delay line length in DLLs.

BACKGROUND OF THE INVENTION

Delay locked loop circuitry typically provides clock deskew functionality in computer processing environments. More recently, DLLs have found application in memory devices, such as SDRAM (synchronous dynanic access memory). In order to achieve sufficient coverage of frequency ranges and guarantee desired resolution, DLLs generally require long delay lines.

A diagram of a typical digital DLL is illustrated by FIG. 1. An input clock signal, CLKIN, is received via a buffer 10. The buffer 10 provides a buffered clock signal CKI and is coupled to a phase detector 12, a shift register 14, and a delay line 16. The delay line 16 is further coupled to a buffer 18 through which an output clock signal, CLKOUT, is produced. The CLKOUT signal is buffered through a buffer 20 to produce a feedback clock signal, CKF, to the phase detector 12. In operation, the phase detector 12 determines if a phase difference exists between the buffered input and feedback clock signals, CKI and CKF. The phase difference determines an appropriate shift in the buffered input clock signal via adjustment of the shift register 14 to select sufficient delay via the delay line 16, as is well understood by those skilled in the art.

While digital DLLs, such as that shown in FIG. 1, do provide clock deskew capabilities, several disadvantages result as clock speeds continue to increase. In order to achieve high resolution and coverage of wide frequency ranges, the delay cells in the delay line 16 and associated register cells in shift register 14 increase in number. For example, typically 20–30 serially coupled buffers for delay line 16 are needed for 200 MHz (megahertz) clock signals. The expansion in length of the delay line leads to larger silicon area requirements and higher power consumption. Other problems with increased delay line length include a longer lock-in time and larger high frequency signal distortion.

Attempts to combat the problems associated with increasing delay line lengths typically involve complicated circuitry, such as addition of additional delay lines and mixers, through analog circuitry. The additional circuitry results in greater complexity and thus greater expense, which is particularly detrimental for DRAM circuits. Therefore, a need exists for more elegant and cost effective solutions to reducing delay line length in DLLs.

SUMMARY OF THE INVENTION

The present invention meets these needs. A digital delay lock loop (DLL) circuit for clock signals with reduced delay line length includes a first phase difference detector for detecting a first phase difference, and a second phase difference detector for detecting a second phase difference. The circuit further includes an inverter coupled to the second phase difference detector for inverting an input clock signal, and a switch controlled by the second phase difference detector for switching between the input clock signal and the inverted input clock signal in accordance with the second phase difference to provide a clock signal to the first phase difference detector.

In a method aspect, a method for reducing delay line length in a digital delay locked loop (DLL) includes determining a phase difference between an input clock signal and a feedback clock signal, and maintaining the phase difference between the input clock signal and the feedback clock signal within approximately 180°. The method also includes delaying the input clock signal to compensate for the phase difference, wherein a number of delay cells utilized is reduced by approximately one-half.

With the aspects of the present invention, reduced delay line length in a DLL results through straightforward and efficient circuitry. The reduction in delay line length produces a reduction in the number of register cells, which further results in lower power consumption and required silicon area for the DLL circuitry. These and other advantages of the aspects of the present invention will be more fully understood in conjunction with the following detailed description and accompanying drawings.

DETAILED DESCRIPTION

The present invention relates to reducing delay line lengths in DLLs. The following description is presented to enable one of ordinary skill in the art to make and use the invention and is provided in the context of a patent application and its requirements. Various modifications to the preferred embodiment and the generic principles and features described herein will be readily apparent to those skilled in the art. Accordingly, it should be appreciated that although the following is described with reference to a digital DLL, the principles of the technique of the present invention are equally applicable to analog DLL circuits, as well. Further, preferred embodiments with specific logic components are described. However, other arrangements of components to achieve the benefits of the present invention may be used according to specific design reeds without departing from the spirit and scope of the present invention.

Figure 1:
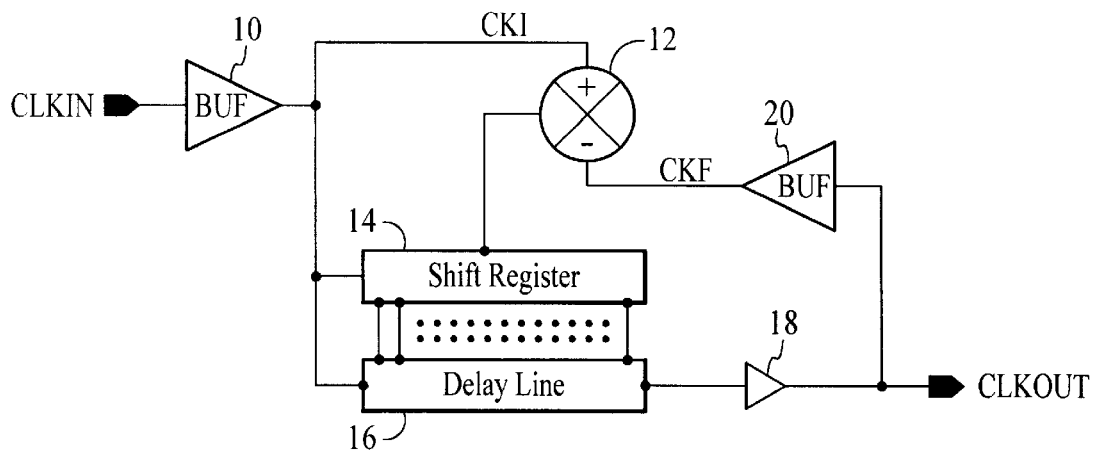
FIG. 1 illustrates a diagram of a typical digital DLL.
Figure 2:
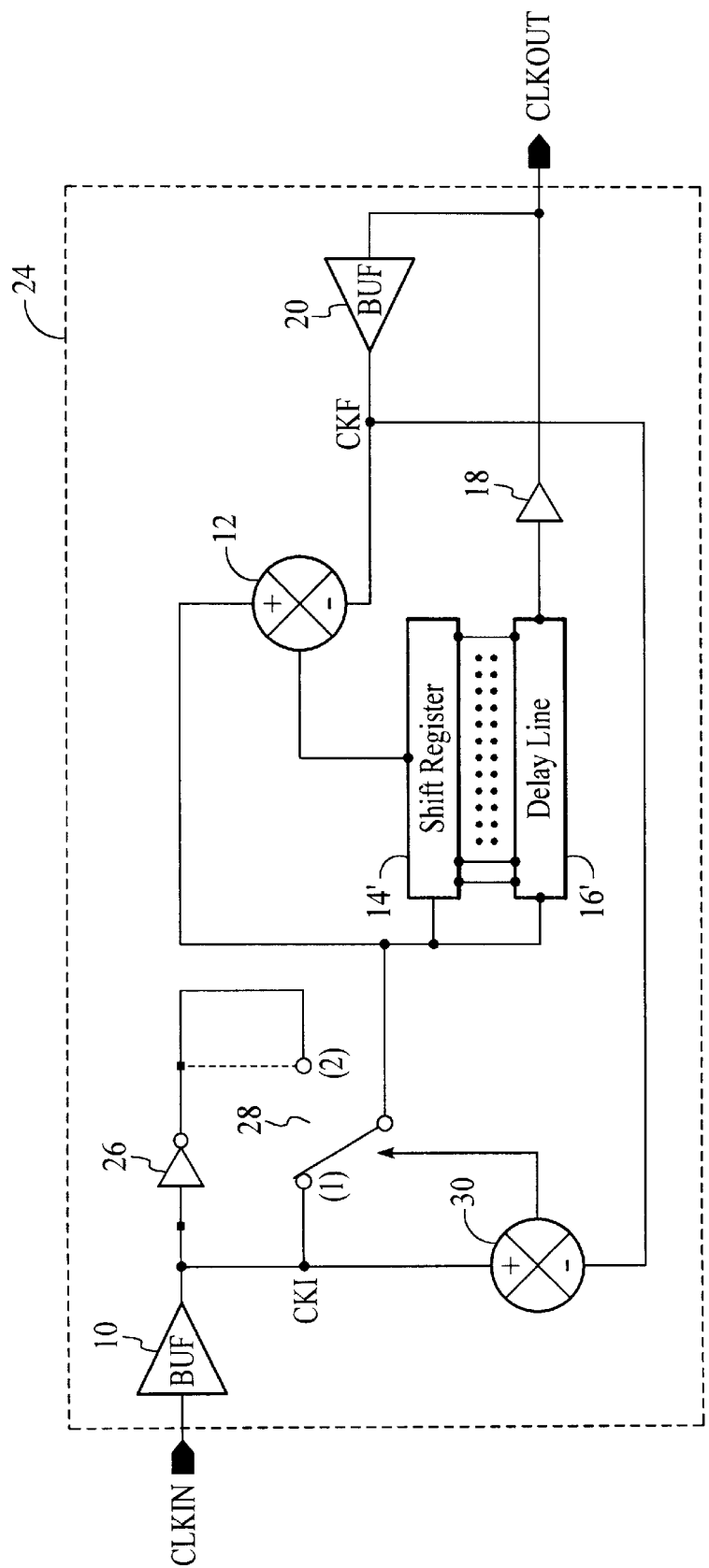
FIG. 2 illustrates a diagram of a digital DLL in accordance with the present invention.

FIG. 2 illustrates a digital DLL 24 in accordance with the present invention. Like components to those shown in FIG. 1 have been numbered similarly. Thus, the input clock signal CLKIN is received via a buffer 10. The output clock signal CLKOUT is output from the DLL via buffer 18. The phase detector 12 receives a feedback clock signal CKF via buffer 20. In accordance with the present invention, the DLL 24 further includes an inverter 26, a switch (e.g., a transistor) 28, and a second phase detector 30. Through the arrangement of the DLL 24, the length of the delay line 16' and correspondingly the number of cells in the shift register 14' are reduced.

In operation, the second phase detector 30 preferably controls the course of the buffered input clock signal CKI by controlling the selection of the switch 28. When the second phase detector 30 determines that the feedback clock signal CKF from the DLL 24 is behind the buffered input clock CKI within a 180° phase difference, the second phase detector 30 controls the switch 28 to be at position (1). The inverter 26 is thus bypassed, and the operation of DLL 24 proceeds in a typical manner as described with reference to FIG. 1. With the second phase detector 30 determining that CKF was within 180° behind CKI, the delay line 16' is required to compensate for a less than 180° phase difference after the DLL 24 gets locked by the feedback through phase detector 12.

When the second phase detector 30 determines that CKF is more than 180° behind CKI, the second phase detector 30 controls switch 28 to be at position (2). The inverted buffered clock signal is thus selected, so that the input clock signal CKI is reversed by 180° Through the inversion, the phase difference needing to be compensated by the delay line 16' is made less than 180° and within the normal operation capabilities of the phase adjusting loop formed by phase detector 12, shift register 14' and delay line 16'.

Through the DLL 24 of the present invention, the delay line 16' requires approximately one-half the length that a typical DLL would require for comparable clock deskewing needs. For example, for a 200 MHz clock, the typical DLL would require approximately 20–30 delay cells/buffers. In contrast, with the present invention, only approximately 10 delay cells are needed. Correspondingly, only approximately 10 register cells would be needed in shift register 14' in this example embodiment of DLL 24. Regardless of the number of register cells, suitably the shift register 14' starts at a point close to the beginning of delay line 16' with shifting starting to the right.

Figure 3:
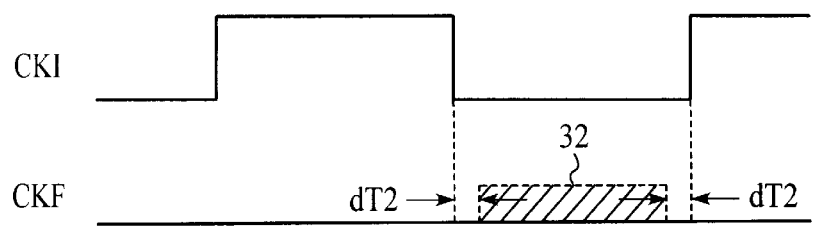
FIG. 3 illustrates a control mechanism utilized with phase detector 30 of FIG. 2 in accordance with the present invention.

Second phase detector 30 is preferably provided as a low resolution detector to avoid possible improper phase jumping when the phase difference is substantially close to 0° or 180° and with a resolution lower than that of phase detector 12 (e.g., a 500 picosecond resolution for phase detector 30 and a 200 picosecond resolution for phase detector 12). For example, FIG. 3 illustrates a representation of buffered input clock signal CKI. During the time period represented by the shaded portion 32 of the feedback clock signal CKF, a rising edge of CKF would result in the second phase detector 30 switching the switch 28 to position (2). To not cause false transitions, the detection period is approximately 20% less than the minimum clock period in normal operation, thus leaving a time separation between the edge of shaded portion 32 and the edges of CKI, referenced in FIG. 3 as $dT_2$.

With the aspects of the present invention, a shorter delay line in a DLL is effectively achieved in a direct and uncomplicated manner. The reduction in delay line length produces a reduction in the number of register cells, which further results in lower power consumption and required silicon area for the DLL circuitry. Such reductions in power consumption and required silicon area are of particular benefit in critical applications, including SDRAMs. In addition, the shorter delay line provided through the present invention enhances performance by reducing high frequency distortion in the DLL.

Although the present invention has been described in accordance with the embodiments shown, one of ordinary skill in the art will recognize that there could be variations to the embodiment and those variations would be within the spirit and scope of the present invention. Accordingly, many modifications may be made by one of ordinary skill without departing from the spirit and scope of the present invention, the scope of which is defined by the following claims.

What is claimed is:

1. A digital delay lock loop (DLL) circuit for clock signals with reduced delay line length, the digital DLL comprising:

a first phase difference detector for detecting a first phase difference between a clock signal and a feedback clock signal;

a second phase difference detector for detecting a second phase difference between a buffered clock signal and the feedback clock signal;

an inverter coupled to the second phase difference detector, the inverter inverting an input clock signal; and a switch controlled by the second phase difference detector for switching between the input clock signal and the inverted input clock signal in accordance with the second phase difference to provide the clock signal to the first phase difference detector.

2. The circuit of claim 1 wherein the first phase difference detector has a first resolution.

3. The circuit of claim 2 wherein the second phase (difference detector has a second resolution, the second resolution being lower than the first resolution.

4. The circuit of claim 1 wherein the second phase difference detector controls the switch to select the input clock signal when the second phase difference is less than approximately 180°.

5. The circuit of claim 4 wherein the second phase difference detector controls the switch to select the inverted input clock signal when the second phase difference is greater than approximately 180°.

6. The circuit of claim 1 further comprising a shift register controlled by the first phase difference detector and a delay line coupled to the shift register with one shift register cell provided for each delay line cell.

7. The circuit of claim 1 wherein the first phase difference is maintained between 0° and 180°.

8. A method for reducing delay line length in a digital delay locked loop (DLL), the method comprising:

determining a phase difference between an input clock signal and a feedback clock signal;

maintaining the phase difference between the input clock signal and the feedback clock signal within approximately 180°, including selecting an inverted input clock signal as the input clock signal when the determined phase difference is greater than approximately 180°; and delaying the input clock signal to compensate for the phase difference, wherein a number of delay cells utilized is reduced by approximately one-half.

9. The method of claim 8 wherein the step of delaying further comprises adjusting the inverted clock signal appropriately with a loop comprising a phase detector, shift register, and delay line.

10. A method for reducing delay line length in a digital delay locked loop (DLL), the method comprising:

determining a phase difference between an input clock signal and a feedback clock signal;

maintaining the phase difference between the input clock signal and the feedback clock signal approximately 180°, including adjusting the input clock signal with a loop comprising a phase detector, shift register, and delay line when the determined phase difference is less than approximately 180°; and delaying the input clock signal to compensate for the phase difference, wherein a number of delay cells utilized is reduced by approximately one-half.

11. The method of claim 10 wherein the phase detector comprises a phase difference detector with a first resolution.

12. The method of claim 11 wherein the step of determining a phase difference occurs through a second phase difference detector with a second resolution, the second resolution being lower than the first resolution.

13. A method for reducing delay line length in a digital delay locked loop (DLL), the method comprising:

determining whether a feedback clock signal in the DLL follows within a 180° phase difference behind an input clock signal; and selecting a switch position according to the determining step, including selecting a first switch position when the feedback clock signal follows behind the input clock signal with 180°.

14. The method of claim 13 wherein the first switch position selects the input clock signal for transfer through the DLL.

15. The method of claim 13 wherein selecting further comprises selecting a second switch position when the feedback clock signal does not follow the input clock signal within 180°.

16. The method of claim 15 wherein the second switch position selects an inverted input clock signal for transfer through the DLL.

* * * * *